(12) United States Patent
Kahlman (10) Patent No.: US 7,218,254 B2
(45) Date of Patent: May 15, 2007

(54) BALANCED DISPARITY CHANNEL CODE FOR DC CONTROL

(75) Inventor: Josephus Arnoldus Henricus Maria Kahlman, Eindhoven (NL)

(73) Assignee: Koninklike Philips Electronics N.V., Eindhoven (NL)

(*) Notice: Subject to any disclaimer, the term of this patent is extended or adjusted under 35 U.S.C. 154(b) by 0 days.

(21) Appl. No.: 10/517,976

(22) PCT Filed: Jun. 17, 2003

(86) PCT No.: PCT/IB03/02742

§ 371 (c)(1),
(2), (4) Date: Dec. 15, 2004

(87) PCT Pub. No.: WO04/001747

PCT Pub. Date: Dec. 31, 2003

(65) Prior Publication Data

US 2005/0219074 A1    Oct. 6, 2005

(30) Foreign Application Priority Data

Jun. 20, 2002    (EP)    ................. 02077528

(51) Int. Cl.
  H03M 1/34    (2006.01)
(52) U.S. Cl. .......................... 341/58; 341/50

(58) Field of Classification Search ............ 341/58, 341/59, 50, 67, 65

See application file for complete search history.

(56) References Cited

U.S. PATENT DOCUMENTS

| | | | | |
|---|---|---|---|---|
| 5,463,699 A * | 10/1995 | Wilkinson | ............... | 382/246 |
| 5,818,362 A * | 10/1998 | Walker | ............... | 341/57 |
| 5,892,466 A * | 4/1999 | Walker | ............... | 341/57 |
| 6,333,704 B1 * | 12/2001 | Jung et al. | ............... | 341/58 |
| 6,496,540 B1 * | 12/2002 | Widmer | ............... | 375/242 |
| 6,876,315 B1 * | 4/2005 | Widmer | ............... | 341/58 |
| 2003/0080882 A1 * | 5/2003 | Rezzi et al. | ............... | 341/68 |

FOREIGN PATENT DOCUMENTS

EP    0758825 A1    2/1997

* cited by examiner

Primary Examiner—Peguy JeanPierre
(74) Attorney, Agent, or Firm—Michael E. Belk (57) ABSTRACT

A coder is fed with precoded data such that the absolute value of the running digital sum (RDS) of the code words as produced by the coder is limited. This is achieved by ensuring that in a group of 2 code words, the RDS of the first code word is compensated by the RDS of the second code word. The RDS at the end of the second code word is then zero and the excursions of the RDS from the start of the first code word until the end of the second code word are limited because there are only a limited number of bits that can contribute to an increase of the absolute value of the RDS.

25 Claims, 9 Drawing Sheets

| IN | OUT |
|---|---|
| 00 | 1010 |
| 01 | 0001 |
| 10 | 0111 |
| 11 | 0101 |
| 1010 | 00001000 |

FIG.5

| IN | OUT |
|---|---|
| 1010 | 00 |
| 0001 | 01 |
| 0111 | 10 |
| 0101 | 11 |
| 00001000 | 1010 |

BALANCED DISPARITY CHANNEL CODE FOR DC CONTROL

The invention relates to a method for coding a stream of input words using a channel code, comprising the steps of
coding the stream of input words into a stream of precoded input words
coding the stream of precoded input words into a stream of groups of N code words.

The invention further relates to a method of producing a record carrier on which a modulated signal obtained according to the previous method is recorded.

The invention also relates to a coding device for generating a channel code.

The invention further relates to a recording device in which such a coding device is used.

The invention furthermore relates to a decoding device.

Finally, the invention relates to a reading device in which a record carrier of this type is used.

Such methods, such devices, such a record carrier and such a signal are known from PHQ98023.

When data is transmitted through a transmission line or recorded onto a recording medium such as a magnetic disc, an optical disc or a magneto-optic disc, the data is modulated into code matching the transmission line or the recording medium prior to the transmission or recording. As a technique of modulation, block encoding is known. In the block encoding, a data string is blocked into units each comprising m×i bits. Each of the units which is referred to hereafter as a data word is then converted into a code word comprising n×i bits in conformity with a proper coding rule. For i=1, this code word is a fixed length code. In the case of i having a plurality of values each selected from the range 1 to imax, a maximum of i, the resulting code word is a variable length code. In general, a code resulting from the block encoding is expressed as a variable length code (d, k; m, n; r).

Here, i is called a constraint length and r is imax, a maximum constraint length. d is the minimum number of 0s appearing between two consecutive 1s. d is referred to as a minimum run of 0s. On the other hand, k is the maximum number of 0s appearing between two consecutive 1s. k is referred to as a maximum run of 0s.

By the way, in an operation to record variable length code obtained from the block encoding described above onto a recording medium such as an optical disc or a magneto-optic disc, for example, on to a compact disc (CD) or a minidisc (MD), the variable length code undergoes an NRZI (Non Return to Zero Inverted) modulation wherein each "1' of the variable length code is interpreted as inversion while a "0" is interpreted as non-inversion The variable length code completing the NRZI modulation is then recorded. The variable length code completing the NRZI modulation is referred to as a recording wave train. In the case of a magneto-optic disc conforming to the early ISO specifications prescribing a not so large recording density, a train of bits completing recording modulation are recorded as they are without undergoing the NRZI modulation.

As described above, when data is transmitted through a transmission line or recorded onto a recording medium, the data is modulated into code matching the transmission line or the recording medium prior to the transmission or recording. If the code resulting from the modulation contains a direct current component, a variety of error signals such as tracking errors generated in control of a servo of the disc drive become prone to variations or jitters are generated easily. For this reason, it is thus desirable to make as many efforts to prevent the modulated code from containing a direct current component as possible.

In order to prevent the modulated code from containing a direct current component, control of a RDS (Running Digital Sum) to prevent the modulated code-from containing a direct current component has been proposed. The RDS is a total found by adding up the values of a train of bits (symbols of data), wherein the values +1 and −1 are assigned to "1" and "0" in the train respectively, which results from NRZI modulation (that is, level encoding) of a train of channel bits. The RDS is an indicator of a direct current component contained in a train of codes. Decreasing the absolute value of the RDS through RDS control is equivalent to suppressing the magnitude of a direct current component contained in a train of codes.

One method for controlling the RDS employs a precoder which inserts RDS control bits into the data stream before the data stream enters the coder.

RDS control is accomplished by calculating a RDS of a train of encoded bits (a train of channel bits) after the modulation for a predetermined period of time and inserting a predetermined number of RDS control bits into the train of encoded bits (the train of channel bits).

At any rate, the RDS control bits are basically redundant bits. If the efficiency of the code conversion is to be taken into consideration, it is thus desirable to reduce the number of RDS control bits to a smallest possible value.

In addition, if RDS control bits are inserted, it is also desirable to make the minimum run d and the maximum run k unchanged. This is because a change in (d, k) will have an effect on recording/playback characteristics.

PHQ 98023/WO 99/0948/EP application number 99919490.5 addresses the problems described above by allowing RDS control to be executed for producing high efficiency control bits.

Much like the conventional method, after a data string is converted by using a conversion table RDS control can be executed by adding RDS control bits at predetermined intervals to a train of channel bits resulting from the conversion. By making use of the relation between the data string and the string of code words resulting from conversion based on a conversion table, the RDS control can be executed.

Insertion of RDS control bits having a value of "1" to indicate inversion and a value of "0" to indicate non-inversion into a train of channel bits is equivalent to insertion of RDS control bits having a value of "1" to indicate inversion and a value of "0" to indicate non-inversion into a train of data bits.

Thus, inserting bits in the data stream before the coder allows control of the RDS of the stream of code words after the coder.

If the data rate used in a section of a storage medium is reduced it is more likely that the modulated data will have DC components. An example of a section of a storage medium where the data rate is reduced is the Program Information and Calibration area, the PIC band, on an optical disc. Here pre-recorded information is stored using for instance HFM grooves. The data in this area is recovered in that the grooves are being tracked by the tracking system and deviations from the expected course of the groove represent the data modulated onto the groove. It is important to ensure the minimum amount of DC in the data modulated onto the groove in order to be able to recover the data reliably.

The method of DC control where bits are inserted into the bitstream before the coder at predetermined intervals has the drawback that between the inserted RDS control bits the RDS value can vary and deviate considerably from zero, thus not assuring the lowest possible RDS as required by tracking system in the PIC band. Also because the data rate in the PIC band is lower than the data rate outside the PIC band the modulated date in the PIC band can easily interfere with the DC control causing problems in the tracking of the groove.

It is an object of the present invention to provide improved DC control of the code words produced by a coder.

In order to achieve this objective the present invention is characterised in that the running digital sum of each group of N code words equals zero.

By preceding such that the absolute value of the RDS returns to zero every N code words the excursions of the absolute value of the RDS are automatically kept small since there are only N code words in which the absolute value of the RDS can increase and deviate more and more from zero.

Since the excursions of the RDS are kept very small locally the overall variations of the RDS will also remain very small. Since the local excursions of the RDS are small and of short duration, limited by the choice of N, the modulated signal will have a very low DC component. For optical and magnetic storage media this means that the tracking will be affected only minimally by the presence of modulated data on the groove.

A further embodiment of the present invention is characterized in that N equals 2.

By choosing N equals 2 it is assured that the excursions of the absolute value of the RDS are kept very small since there are only two code words in which the absolute value of the RDS can increase and deviate more and more from zero. Further more the choice of N equals 2 ensures a very short duration of each excursion of the absolute value of the RDS and thus of the DC components.

A further embodiment of the invention is characterized in that after the step of coding the stream of precoded input words into a stream of groups of N code words the method comprises the step of storing the groups of N code words in using the groove position modulation on the storage medium.

When storing information on a storage medium using a groove position modulation it is essential that as little DC as possible is present in the code words because the data is recovered by demodulation the tracking errors while tracking the groove on the storage medium. The preceding according to the invention allows the reduction of the DC components in a stream of code words and is therefore especially suitable when using groove position modulation.

A further embodiment of the invention is characterized in that coding the precoded stream of input words is achieved using a parity preserving coder.

A further embodiment of the invention is characterized in that the parity preserving coder is a 17PP coder.

The 17PP coder is normally used for coding the data outside the PIC band and produces unacceptable interference with the tracking in the PIC band. The DC control as provided by the present invention enables the use of the 17PP coder for coding both the data outside the PIC band and within the PIC band. This has the advantage that it is no longer necessary to have two different coders for the two areas, thus reducing the complexity of the apparatus using the method according to the invention.

Also it is no longer required to have two different decoders when decoding the retrieved data because one 17PP coder can decode both the data outside the PIC band and within the PIC band.

A further advantage of this embodiment is that the d, k and RMTR constraints of the code are maintained since the standard 17PP coder is used to encode the precoded input words.

A further embodiment of the invention is characterized in that the stream of M input words is precoded using the following table:

| In | Out |
|---|---|
| 00 | 1010 |
| 01 | 0001 |
| 10 | 0111 |
| 11 | 0101 |
| 1010 | 00001000 |

Because of the variations in word length in the 17PP coder it is difficult to guarantee adequate DC control. When the data is precoded according to the table it is assured that the running digital sum of a group of 2 code words equals zero when using a 17PP coder after the precoder. In this way the objective of the invention is achieved.

Two mechanisms contribute to the reduction in DC:
The data rate is doubled because the precoder produces 4 bits for every 2 bits it processes. This moves the spectral energy of the code words away from the DC area to a higher frequency.
The precoder ensures that the running digital sum of each group of two code words equals zero The excursions of the absolute value of the RDS are kept very small since there are only two code words in which the absolute value of the RDS can increase and deviate more and more from zero. Further more this choice of precoding ensures a very short duration of each excursion of the absolute value of the RDS and thus of the DC components.

The combined effect of these two mechanisms was found to reduce the DC components to a level acceptable for the tracking mechanism in the PIC band.

A further embodiment of the invention is characterized in that the stream of M input words is precoded using the following table:

| | | |
|---|---|---|
| 00 | -> | 10 10 |
| 10 | -> | 00 01 |
| 11 | -> | 01 11 |
| 01 | -> | 01 01 |
| 11 11 | -> | 00 00 10 00 |

This embodiment has the same advantages as the previous embodiment, and shows that different precoders can obtain similar effects when precoding for the same coder.

A further embodiment of the invention is characterized in that before the step of storing the groups of N code words in using the groove position modulation on the storage medium remaining DC components are removed using a high-pass filter.

Because the precoding in the previous two embodiment increases the data rate the spectral content of the code words is shifted to higher frequencies before being stored using groove position modulation. It is consequently easier to apply a high-pass filter to the modulated code words to further reduce the DC components.

It should be noted that precoding can only affect the data as produced by the coder. If the coder inserts other elements into the encoded data stream, for instance sync words, precoding cannot change the RDS of the sync patterns.

In order to overcome this problem the RDS of the sync pattern can be compensated by data directly following the sync pattern if the precoder is aware of the location in the encoded data stream of the data that is being precoded. This leads to a small loss of data storage capacity but ensures that at the end of the compensation word directly behind the sync pattern the RDS is zero.

The invention will now be discussed based on figures.

Although the figures are described in terms of groove position modulation, PIC band and an optical storage medium, the invention can equally be applied to other modulations and applications such as data communications where DC components are to be avoided in order to reduce interference with proper demodulation and/or tracking.

Figure 1:
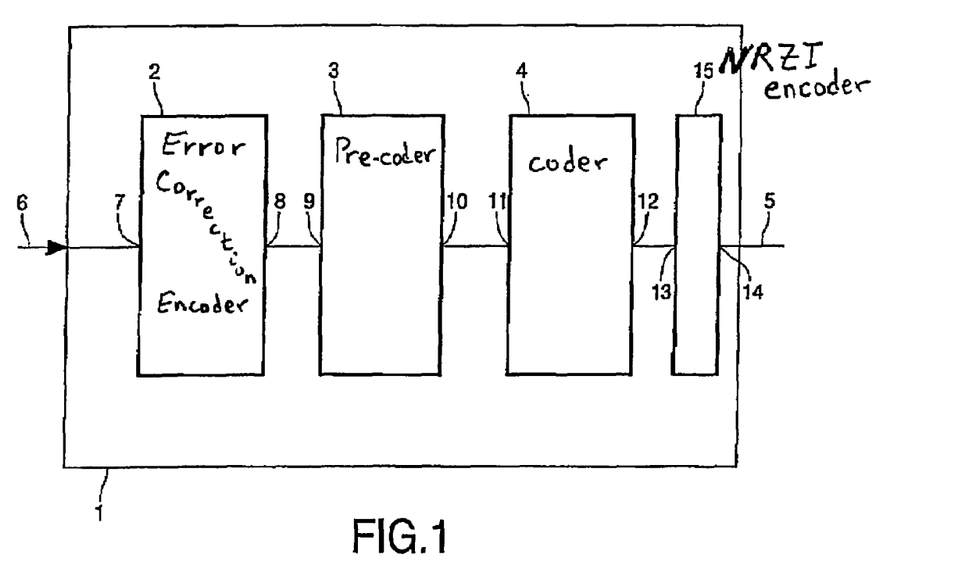
FIG. 1 shows a system using the precoder.

FIG. 1 shows an encoding system using the precoder.

The encoding system 1 receives data to be encoded on the input 6. The input 6 is connected to the input 7 of the error correction encoder 2. The error correction encoder 2 is included in order to show the location of the precoder 3 in a typical encoding system 1 but is not essential to the invention.

The data comprising the error correction is then provided by the error correction encoder 2 via its output 8 to the input 9 of the precoder 3. The precoder then precodes the data comprising the error correction and provides the precoded data via its output 10 to the input 11 of the coder 4. The coder 4 encodes the precoded data and provides the resulting code words via its output 12 to the input 13 of the NRZI encoder 15. The NRZI encoder 15 provides the NRZI encoded code words via its output 14 to the output 5 of the encoding system 1.

The precoding performed by the precoder 3 is closely linked to the encoding performed by the coder 4 since the precoding targets characteristics of the code words as produced by the coder 4. The coder type used throughout the discussion of the figures is a 17PP coder.

The coder 4 is fed with precoded data such that the absolute value of the RDS of the code words as produced by the coder 4 is limited. This is achieved by ensuring that in a group of 2 code words the RDS of the first code word is compensated by the RDS of the second code word. The RDS at the end of the second code word is then zero and the excursions of the RDS from the start of the first code word until the end of the second code word are limited because there are only a limited number of bits that can contribute to an increase of the absolute value of the RDS.

The coder 4 can be for instance a 17PP coder.

Figure 2:
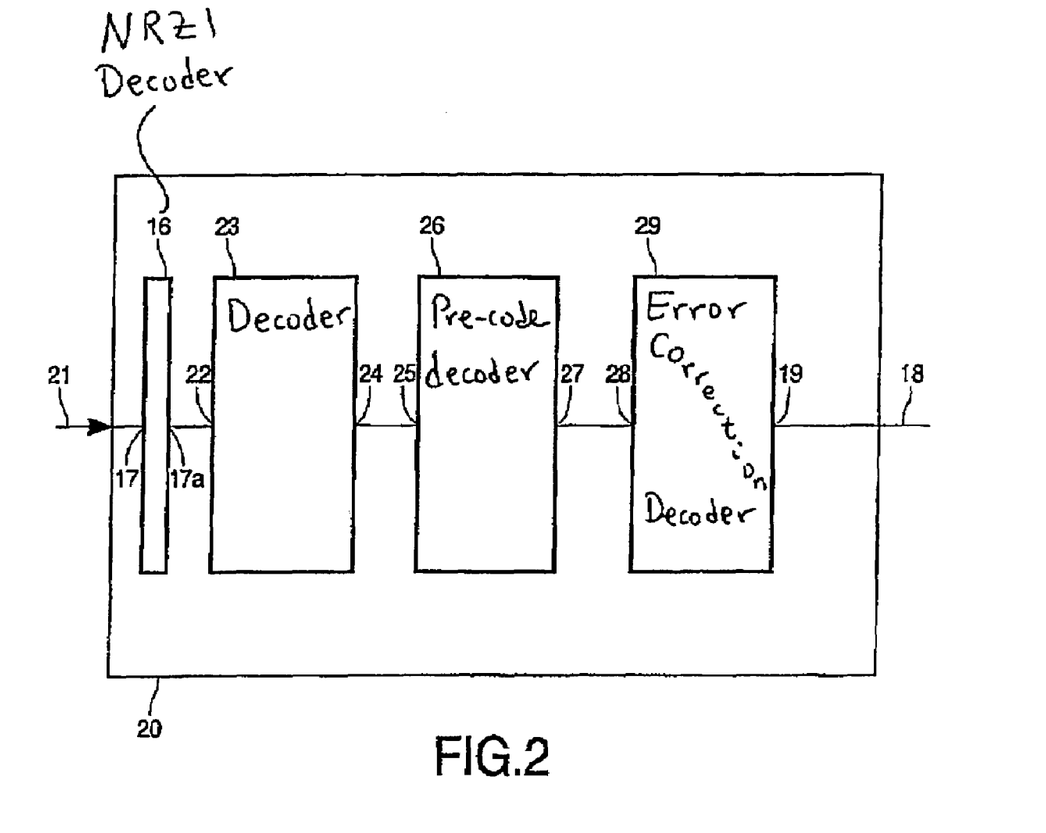
FIG. 2 shows a receiver according to an embodiment.

FIG. 2 shows a decoding system for retrieving the original data.

The decoding system 20 receives the NRZI encoded code words at its input 21 and provides the NRZI encoded received code words to the input 17 of the NRZI decoder 16. The NRZI decoder 16 removes the NRZI code and provides the code words thus obtained via its output 17a to the input 22 of the decoder 23. The decoder 23 decodes the code words and thus retrieves the precoded data comprising error correction and provides this data via its output 24 to the input 25 of the precode decoder 26. The precode decoder 26 decodes the data received from the decoder 23 and provides the precode decoded data via its output 27 to the input 28 of the error correction decoder 29. The error correction decoder 29 removes the error correction coding from the precode decoded data and performs the associated error correction. The error correction decoder then provides the resulting data via its output 19 to the output 18 of the decoding system 20. The resulting data corresponds to the input data as provided to the encoding system 1. The decoder 23 can be for instance a 17PP decoder.

Figure 3:
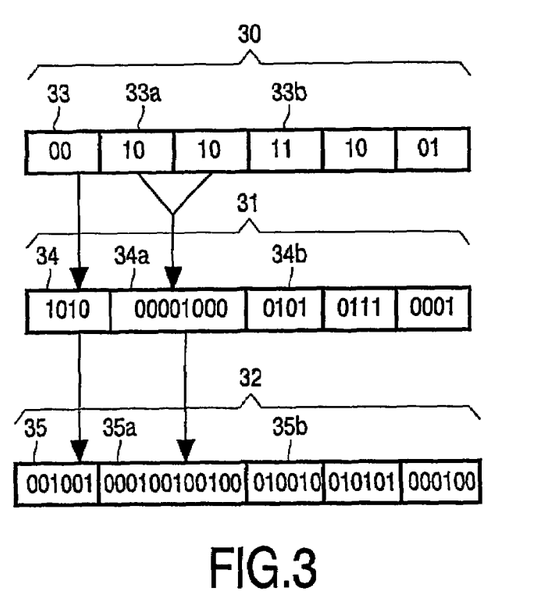
FIG. 3 shows an example encoding of input words.

FIG. 3 shows an example encoding of input words.

The preceding step used in this example uses the following table:

| In | Out |
|---|---|
| 00 | 1010 |
| 01 | 0001 |
| 10 | 0111 |
| 11 | 0101 |
| 1010 | 00001000 |

The stream 30 of input words comprises error correction coded input words 33, 33a, 33b.

This stream 30 is precoded into a stream 31 of precoded input words 34, 34a, 34b.

The stream 31 of precoded input words gets coded by the coder into a stream 32 of code words 35, 35a, 35b.

The input word 33 with value '00' results in the precoded input word 34 with value '1010'. The precoded input word 34 is subsequently coded by the 17PP coder into the code word 35 with a value of '001 001'.

When the precoder encounters a sequence of two input words 33a in the stream of input words 30 with a value of '1010' it precodes these two input words 33a into a sequence of two precoded input words 34a with the value '0000 1000'.

The coder subsequently codes the sequence of two precoded input words 34a into a sequence of two code words 35a with a value of '000 100 100 100'.

It is evident that because the 17PP coder processes the precoded input words, the resulting output words will always comply with the 17PP channel code regarding block size, syncs and number of DC control bits. The resulting code words can therefore be decoded using a standard 17PP decoder, after which only the precoding is to be removed before the error correction coding is removed in order to yield the original input words as were present in the original stream 30 of input words.

Figure 4:
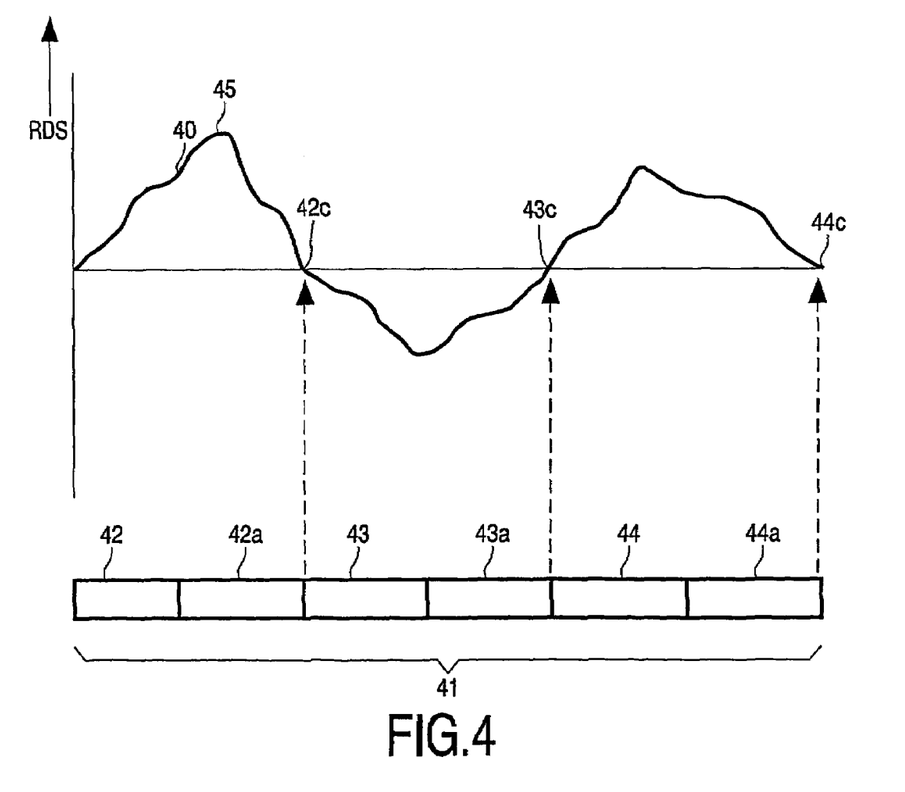
FIG. 4 shows the RDS of a signal according to an embodiment.

FIG. 4 shows the RDS of a signal according to an embodiment.

The example graph shows RDS versus the code words 42, 42a, 43, 43a, 44, 44a.

A group of 2 code words is the first code word 42 and the second code word 42a.

Another group of 2 code words is the third code word 43 and the fourth code word 43a. As can be seen the precoder will ensure that the total RDS for the two code words 42, 42a, 43, 43a, 44, 44a in a group is zero. This is indicated by a zero crossing 42c, 43c, 44c of the graph 40 representing the RDS.

Because the RDS can only increase during at most part of the two code words, during the other part the RDS must return to zero, the maximum of the absolute value of RDS is also limited. Also the duration during which the RDS is not zero is limited to a maximum of 2 code words. This way the overall absolute value of the RDS is kept under tight control and reduced in most situation compared to other methods of DC control to limit the absolute value of the RDS.

Figure 5:
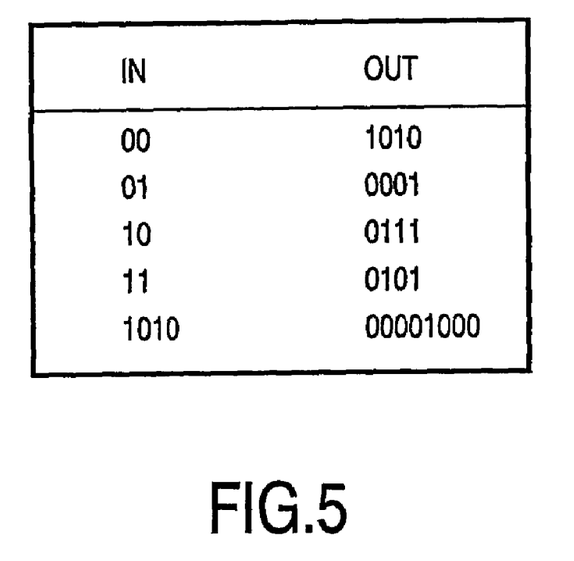
FIG. 5 shows the table used by the pre-coder to pre code the data.

FIG. 5 shows the table used by the pre-coder to pre code the data.

The precoder searches the stream of error correction coded input words for matches with the elements in the 'in' column of the table in FIG. 5. When a match is found the bits in the stream of error correction coded input words that match are replaced by the bits of the corresponding element in the 'out' column of the table in FIG. 5.

For examples when a '00' is encountered these bits are replaced by the bits 1010.

The bitrate is doubled effectively shifting the spectral content of the code words to a higher frequency, while at the same time the elements of the 'out' column are such that, when coded by a 17PP coder, the running digital sum of each group of N code words equals zero.

Figure 6:
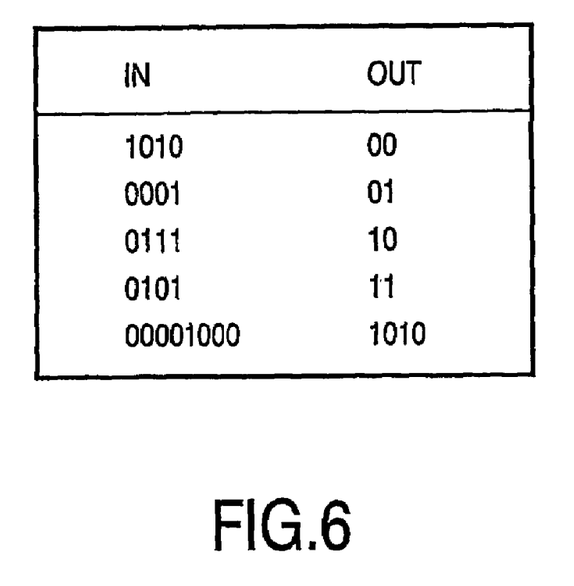
FIG. 6 shows the table used by the decoder.

FIG. 6 shows the table used by the decoder.

The decoder that removes the precoding from the 17PP decoded code words uses the table shown in FIG. 6. Using the table of FIG. 6 the decoder performs the inverse operation of the precoding. After removing the precoding the resulting stream corresponds to the stream of error correction encoded input words in the encoder.

The search and replace operation of the decoder to remove the precoding is similar to the search and replace operation of the precoder, except that the table in FIG. 6 instead of the table in FIG. 5 is used.

Figure 7:
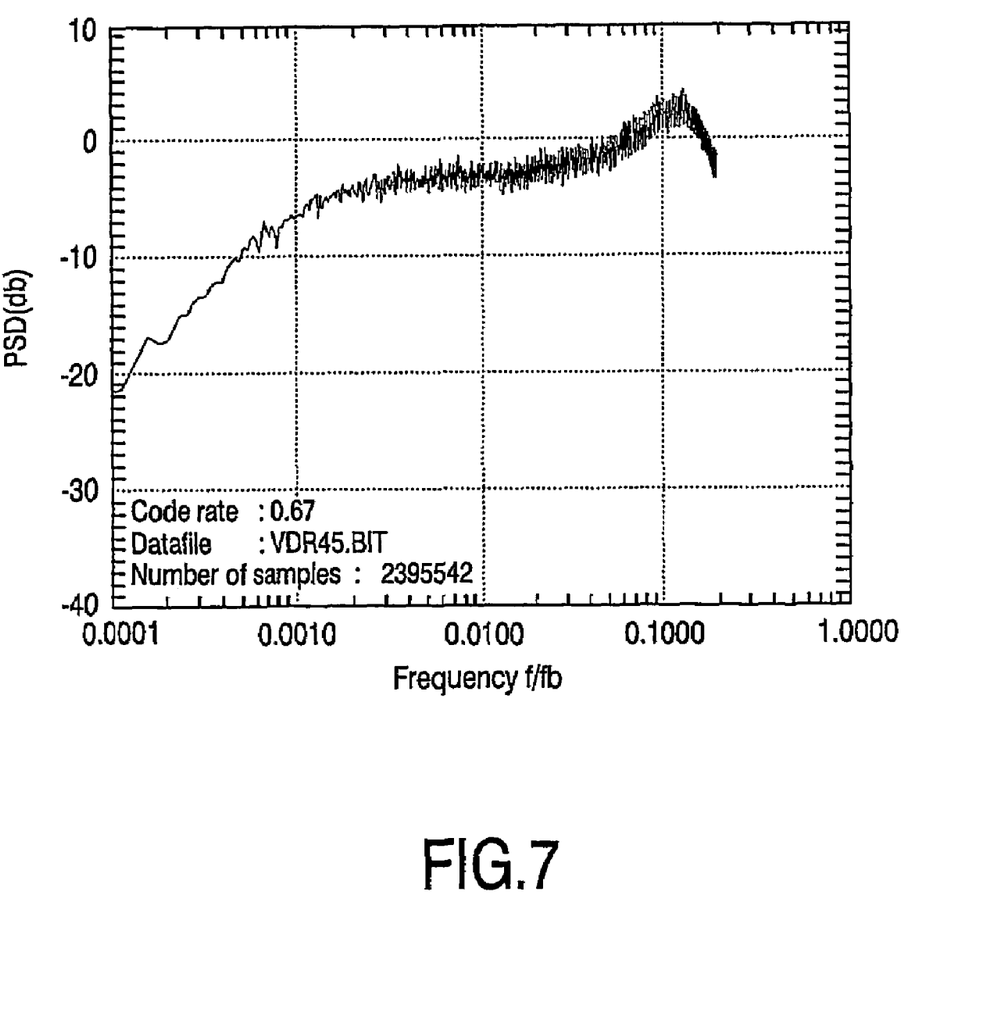
FIG. 7 shows the spectral content of the code words when using a 17PP coder.

FIG. 7 shows the power spectral density of the code words when using a 17PP coder.

The spectrum has some DC content and increases from this level with frequency to a maximum. The curve of the power spectral density is a direct consequence of the characteristics of the code words as produced by the 17PP coder.

Figure 8:
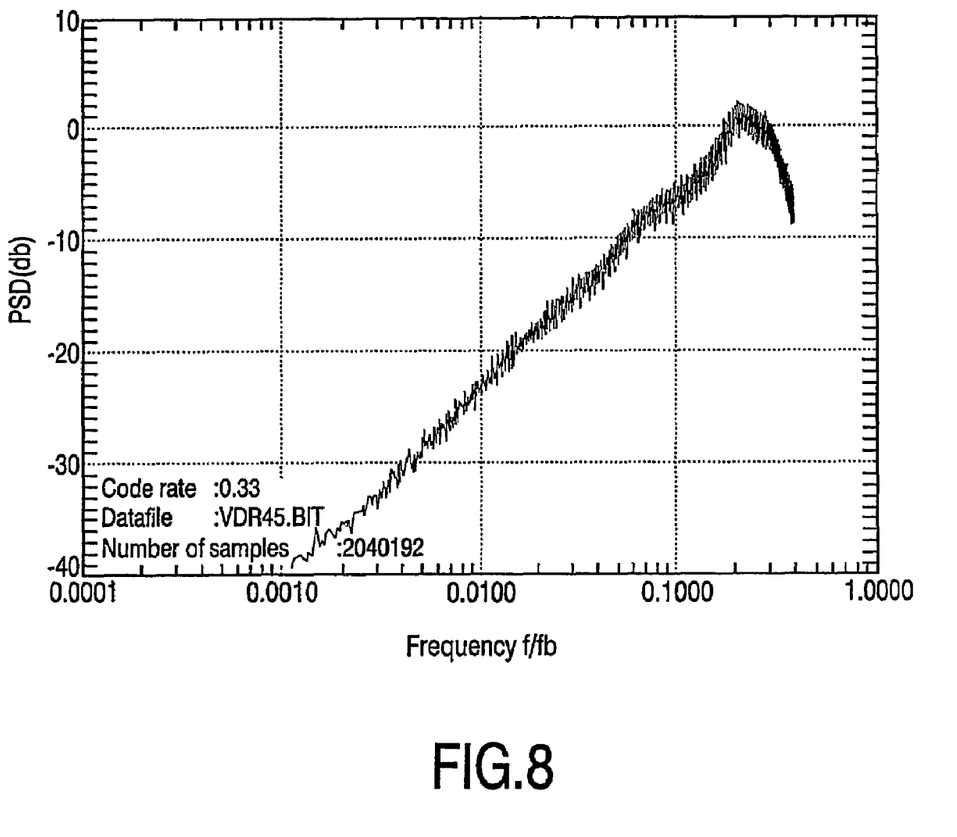
FIG. 8 shows the spectral content of the code words when precoding the input words before coding with the 17PP coder.

FIG. 8 shows the spectral content of the code words when precoding the input words before coding with the 17PP coder.

The precoding achieves a notably lower DC content by the precoding by ensuring that the running digital sum of each group of N code words equals zero. This lowers the absolute value of the RDS and as a consequence it also lowers the DC content. Furthermore because the data rate is increased the entire power spectral density is moved towards higher frequencies. Both effects of the preceding would alone already reduce the DC content, but the combined effect greatly reduces the DC content.

Figure 9:
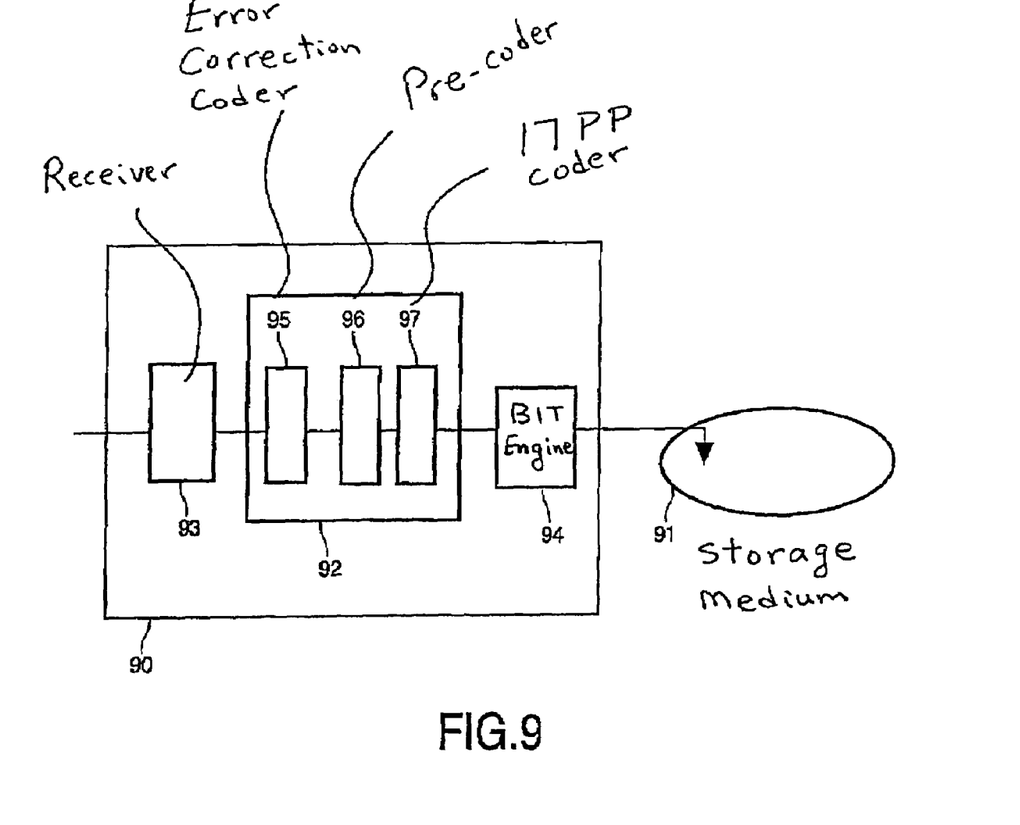
FIG. 9 shows an apparatus for storing data on a storage medium.

FIG. 9 shows an apparatus for storing data on a storage medium.

The apparatus 90 for storing data on a storage medium 91 receives data comprising a stream of input words on its input and provides this stream of input words to a receiving section where signal conditioning is performed and the stream of input words can be processed to determine for instance storage location or storage method.

The receiving section 93 then provides the stream of input words to the encoder 92. The encoder 92 comprises the error correction coder 95, the precoder 96 and the 17PP coder 97, working as described in FIG. 1. The resulting code words as generated by the 17PP coder 97 are provided to the bit engine 94. The bit engine 94 provides the means to store the code words on the storage medium 91. For clarity reasons the optional high pass filter is not shown in FIG. 9 but would be inserted between the output of the 17PP coder 97 and the input of the bit engine 94.

Figure 10:
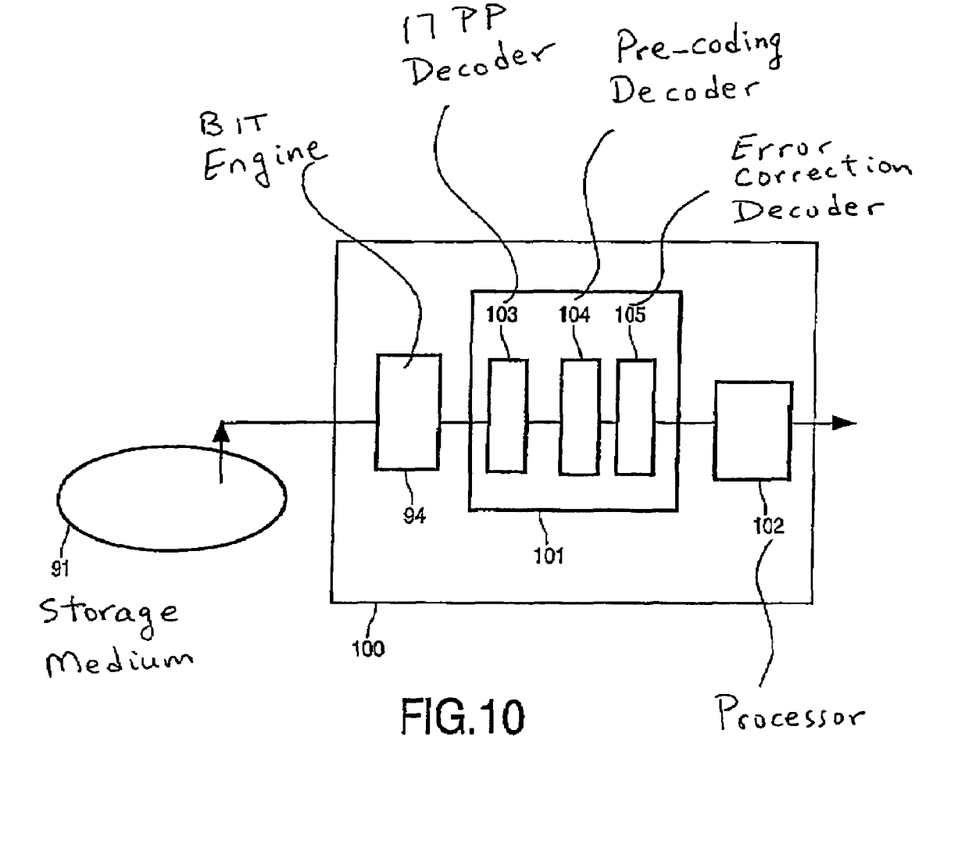
FIG. 10 shows an apparatus for retrieving data from a storage medium.

FIG. 10 shows an apparatus for retrieving data from a storage medium.

The apparatus 100 for retrieving data from a storage medium 91 comprises a bit engine 94 for retrieving the code words from the storage medium 91. The bit engine provides the code words to the decoder 101. The decoder 101 comprises the 17PP decoder 103, the preceding decoder 104 and the error correction code decoder 105. The decoder 101 works as described in FIG. 2. The resulting stream of data words is then provided by the decoder 101 to the processing section 102 where the data can be further processed before being provided to the output of the apparatus 100.

Figure 11:
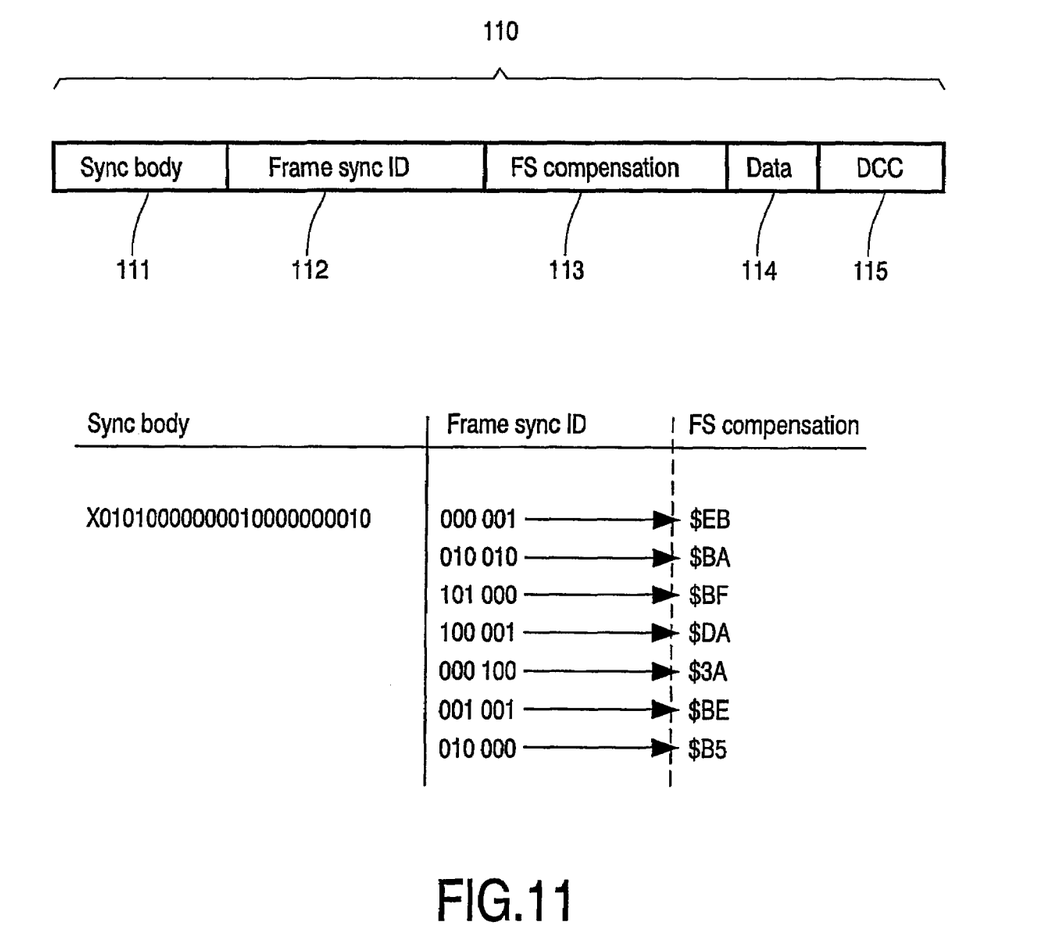
FIG. 11 shows the compensation of the RDS of the sync pattern.

FIG. 11 shows the compensation of the RDS of the sync pattern.

The #0 dc control block 110 comprises a sync body 111 which is always the same, followed by a frame sync ID 112 which can have 7 different values. Normally the frame sync ID 112 is followed by 25 bits with data. In order to be able to compensate for the RDS of the sync body 111 and the frame sync ID 112 8 bits of the 25 data bits are used as frame sync compensation 113 to ensure that the RDS is 0 at the end of the 8 bits used for frame sync compensation 113.

The structure of the #0 DC control block is:

| Sync body | Frame sync ID | FS compensation | Data | DCC |
| --- | --- | --- | --- | --- |

The following table is used for the 17PP coder:

| Sync body | Frame sync ID | FS compensation |
| --- | --- | --- |
| X0101000000010000000010 | 000 001 | $EB |
|  | 010 010 | $BA |
|  | 101 000 | $BF |
|  | 100 001 | $DA |
|  | 000 100 | $3A |
|  | 001 001 | $BE |
|  | 010 000 | $B5 |

The Frame Sync compensation and the remaining data bits 114 are precoded as explained in FIG. 3.

The last bit of the #0 DC control block is the DCC bit 15, as normally used for DC control. This DCC bit 15 is also present in the regular data blocks but when using the method of the present invention for DC control the DCC bit 15 can be ignored in both regular data blocks and in the #0 DC control block, i.e. set to a standard value of 0.

The resulting encoded data stream has a low RDS and thus improved DC control is achieved.

The invention claimed is:

1. A method for coding a stream of input words using a channel code, the method comprising the acts of:
   precoding the stream of input words into a stream of precoded input words; and
   coding the stream of precoded input words into a stream of groups of N code words
   such that a combined running digital sum of each predefined group of N adjacent code words equals zero.

2. The method as claimed in claim 1, wherein N equals 2.

3. The method as claimed in claim 1, wherein after the step of coding the stream of precoded input words into a stream of groups of N code words the method comprises the step of storing the groups of N code words using a groove position modulation on a storage medium.

4. The method as claimed in claim 1, wherein coding the precoded stream of input words is achieved using a parity preserving coder.

5. The method as claimed in claim 4, wherein the parity preserving coder is a 17PP coder.

6. The method as claimed in claim 5, wherein the stream of input words is precoded using the following table:

| In | Out |
|---|---|
| 00 | 1010 |
| 01 | 0001 |
| 10 | 0111 |
| 11 | 0101 |
| 1010 | 00001000. |

7. The method as claimed in claim 6, wherein before the act of storing the groups of N code words in using the groove position modulation on the storage medium remaining DC components are removed using a high-pass filter.

8. The method as claimed in claim 5, wherein the stream of input words is precoded using the following table:

| In | | Out |
|---|---|---|
| 00 | -> | 10 10 |
| 10 | -> | 00 01 |
| 11 | -> | 01 11 |
| 01 | -> | 01 01 |
| 11 11 | -> | 00 00 10 00. |

9. The method as claimed in claim 1, wherein coding the precoded stream of input words is achieved using a parity inverting coder.

10. An apparatus for storing data on a recording medium comprising an encoder which arranged for coding the stream of precoded input words into a stream of groups of N code words and comprising a precoder for coding the stream of input words into a stream of precoded input words such that a combined running digital sum of each predefined group of N adjacent code words equals zero.

11. The apparatus as claimed in claim 10, wherein N equals 2.

12. The apparatus as claimed in claim 10, wherein the apparatus is arranged for storing the groups of N code words using a groove position modulation on a storage medium.

13. The apparatus as claimed in claim 10, wherein the encoder is a parity preserving coder.

14. The apparatus as claimed in claim 13, wherein the parity preserving coder is a 17PP coder.

15. The apparatus as claimed in claim 14, wherein the precoder is operative to precode the stream of input words using the following table:

| In | Out |
|---|---|
| 00 | 1010 |
| 01 | 0001 |
| 10 | 0111 |
| 11 | 0101 |
| 1010 | 00001000. |

16. The apparatus as claimed in claim 15, wherein the apparatus is operative to remove remaining DC components using a high-pass filter before storing the groups of N code words using the groove position modulation on the storage medium.

17. The apparatus as claimed in claim 14, wherein the precoder is operative to precode the stream of input words using the following table:

| In | | Out |
|---|---|---|
| 00 | -> | 10 10 |
| 10 | -> | 00 01 |
| 11 | -> | 01 11 |
| 01 | -> | 01 01 |
| 11 11 | -> | 00 00 10 00. |

18. The apparatus as claimed in claim 10, wherein the encoder is a parity inverting coder.

19. A record carrier comprising a stream of input words stored as a stream of groups of N code words such that a combined running digital sum of each predefined group of N adjacent code words equals zero.

20. The record carrier as claimed in claim 19, wherein N=2.

21. The record carrier as claimed in claim 19, wherein the groups of N code words are stored using a groove position modulation.

22. The record carrier as claimed in claim 19, wherein the stream of input words is precoded using the following table:

| In | Out |
|---|---|
| 00 | 1010 |
| 01 | 0001 |
| 10 | 0111 |
| 11 | 0101 |
| 1010 | 00001000. |

23. The record carrier as claimed in claim 19, wherein the stream of input words is precoded to form precoded words using the following table:

| In | Out |
|---|---|
| 00 | 1010 |
| 10 | 0001 |
| 11 | 0111 |

-continued

| In | Out |
|---|---|
| 01 | 0101 |
| 1111 | 00001000; | wherein "In" represents the stream of input words and "Out" represents the precoded words.

24. A method for decoding a stream of N code words into a stream of N output words, wherein the stream of M output words is postcoded to form postcoded words using the following table:

| In | Out |
|---|---|
| 1010 | 00 |
| 0001 | 01 |
| 0111 | 10 |
| 0101 | 11 |
| 00001000 | 1010; | wherein "In" represents the stream of M output words and "Out" represents the postcoded words.

25. A method for decoding a stream of N code words into a stream of M output words, wherein the stream of M output words is postcoded to form postcoded words using the following table:

| In | Out |
|---|---|
| 1010 | 00 |
| 0001 | 10 |
| 0111 | 11 |
| 0101 | 01 |
| 00001000 | 1111; | wherein "In" represents the stream of M output words and "Out" represents the postcoded words.

* * * * *